United States Patent
Petit et al.

(10) Patent No.: US 6,746,261 B2
(45) Date of Patent: Jun. 8, 2004

(54) PRESSURE APPLICATION DEVICE FOR RETAINING AT LEAST TWO ELECTRONIC COMPONENTS DISPOSED OPPOSITE EACH OTHER ON EACH SIDE OF A CONNECTION BOARD

(75) Inventors: Claude Petit, Villebon-sur-Yvette (FR); Thierry Fromont, Massy (FR); Jean-Paul Prevot, Fontenay-le-Fleury (FR)

(73) Assignee: Bull S.A., Louveciennes (FR)

( * ) Notice: Subject to any disclaimer, the term of this patent is extended or adjusted under 35 U.S.C. 154(b) by 0 days.

(21) Appl. No.: 10/263,094

(22) Filed: Oct. 3, 2002

(65) Prior Publication Data

US 2003/0073330 A1 Apr. 17, 2003

(30) Foreign Application Priority Data

Oct. 17, 2001 (FR) .............................. 01 13391

(51) Int. Cl.$^7$ ................................ H01R 13/62
(52) U.S. Cl. ................. 439/331; 361/704; 324/755
(58) Field of Search ................. 439/71, 74, 330, 439/331, 329, 70, 73; 361/704, 710; 324/755

(56) References Cited

U.S. PATENT DOCUMENTS

| | | | |
|---|---|---|---|
| 3,459,998 A | | 8/1969 | Focarile |
| 5,259,781 A | * | 11/1993 | Baumberger et al. ........ 439/331 |
| 5,967,798 A | * | 10/1999 | Tustaniwskyj et al. ....... 439/71 |
| 5,997,316 A | * | 12/1999 | Kunzel .......................... 439/73 |
| 6,042,412 A | * | 3/2000 | Murr ........................... 439/331 |
| 6,058,014 A | * | 5/2000 | Choudhury et al. ......... 361/704 |
| 6,137,298 A | * | 10/2000 | Binns .......................... 324/755 |
| 6,154,040 A | * | 11/2000 | Tsukamoto et al. ......... 439/331 |
| 6,157,539 A | | 12/2000 | Wagner et al. |
| 6,206,705 B1 | | 3/2001 | Bolotin et al. |
| 6,280,222 B1 | * | 8/2001 | Walkup ....................... 439/331 |

* cited by examiner

*Primary Examiner*—Gary F. Paumen
(74) *Attorney, Agent, or Firm*—Edward J. Kondracki; Miles & Stockbridge P.C.

(57) ABSTRACT

A device for at least two electronic components disposed opposite each other and on each side of the same connection board by application of pressure. At least one small clamping column is arranged to be slid into an opening provided in the connection board, and to receive, at each of its ends, a spring which causes a resilient bracing force to be exerted on a bearing plate in the direction of the connection board. Clamping abutments serve to clamp the clamping column to the connection board. Each clamping column is disposed on each side of the connection board, and spaced from each other by a distance strictly greater than the thickness of the board so as to provide between the board and the abutments a clearance for balancing the retaining force between the two bearing plates.

20 Claims, 2 Drawing Sheets

PRESSURE APPLICATION DEVICE FOR RETAINING AT LEAST TWO ELECTRONIC COMPONENTS DISPOSED OPPOSITE EACH OTHER ON EACH SIDE OF A CONNECTION BOARD

BACKGROUND OF THE INVENTION

The invention relates to a pressure application device for retaining at least two electronic components disposed opposite each other and on each side of the same connection board.

More precisely, the invention relates to a device comprising:

two rigid bearing plates disposed on each side of the connection board, said plates exert a retaining force by pressure on said electronic components in the direction of the connection board, and first fixing or clamping means for fixing or clamping the bearing plates to the connection board comprising at least one small clamping column and urging or resilient bracing means arranged to be mounted at the end of said at least one clamping column for exerting on one of the bearing plates a thrust force in the direction of the connection board.

These pressure retaining devices apply quite particularly to electronic components, the connection of which to a connection board is effected by way of contact terminals. These contact terminals are arranged to co-operate with corresponding contact terminals located on the board to establish the electrical continuity. The electrical continuity between the contact terminals of the electronic component and of the board is obtained by simple mechanical pressure exerted on the electronic component in the direction of the printed circuit.

An electronic component provided with a plurality of contact terminals constituting an LGA (Land Grid Array) flat contact matrix is entirely suited to the employment of these devices, and will therefore serve as example in the continuation of this description.

The connection boards may be of all types of boards intended to receive electrical or electronic components such as printed circuit boards. Since printed circuit boards are particularly common, they will therefore serve as example in the continuation of the description to illustrate an embodiment of the invention.

Conventionally, an electronic component such as an integrated circuit is placed in a housing comprising contact terminals. In the continuation of the description, the expression "LGA integrated circuit" will be used to designate an LGA integrated circuit as well as a circuit placed in a housing.

Conventionally, the LGA integrated circuit has two faces, one active and the other inactive. The active face contains the contact terminals.

Generally, the connection of an LGA integrated circuit on a first face of a printed circuit board necessitates the use of a first bearing plate for exerting a pressure on the inactive face of the LGA integrated circuit and first clamping means for fixing or clamping the plate to the printed circuit board. The first clamping means comprise small columns intended to be fixed or clamped to the printed circuit board by means of inserts or nuts provided in the latter. The term "fixing" when used herein is intended synonymous with the words "clamping" or "holding".

The mounting of a second LGA integrated circuit on the second printed circuit face, opposite to the first, also necessitates a second bearing plate and second fixing or clamping means which are respectively identical to the first bearing plate and to the first fixing means. The second fixing means are also fixed to the printed circuit board by means of inserts or nuts provided in the latter.

The drawback arising from this technique is that it is not possible to place, on each side of the printed circuit board and opposite each other, the fixing inserts or nuts necessary for the first fixing means and those necessary for the second fixing means. Thus it is not possible, with the known devices for retaining electronic components, to retain, by pressure, electronic components disposed opposite each other on each face of the same printed circuit board.

The invention aims to remedy this drawback by proposing a device for retaining by pressure two electronic components disposed opposite each other, each on an opposite face of the same printed circuit board.

BRIEF SUMMARY OF THE INVENTION

The subject of the invention is therefore a pressure retaining device as described above, characterised in that, openings being formed in the connection board, said at least one clamping column is arranged to be mounted so as to be displaceable in translation in one of said openings in order to pass through the connection board and to receive the urging means at each of its ends, and in that it includes two fixing abutments for limiting the translation of said at least one clamping column through the connection board, said fixing abutments each being intended to be disposed on each side of the connection board, spaced from each other by a distance strictly greater than the thickness of the board so as to provide between the board and the abutments a clearance for balancing the retaining force between the two bearing plates.

The device described above makes it possible to retain by pressure at least two electronic components disposed opposite each other, each on a respective face of the same printed circuit board. In fact, in this device, the first and second bearing plates for retaining by pressure the electronic components are fixed to each other by way of small clamping columns passing through the printed circuit board from one side to the other. These plates are therefore no longer fixed by way of respective fixing means to the printed circuit board, and thus it is no longer necessary to provide inserts or nuts in the board.

According to other features of a pressure retaining device according to the invention:

said at least one clamping column includes two receiving means for receiving the fixing abutments and spaced from each other by a distance strictly greater than the thickness of the board, so as to provide between the board and the abutments the clearance for balancing the retaining force between the two bearing plates;

the abutments comprise a stop ring;

the abutments comprise a washer;

the urging means comprise thrust supports intended to be fixed to each end of said at least one small clamping column and resilient means arranged to be interposed between the thrust support and one of the bearing plates for urging the latter against the electronic components;

the resilient means comprise springs;

it includes a locking plate for locking said at least one clamping column in rotation and in which is formed an opening intended for slidingly receiving said at least one clamping column, the profile of the opening, and that of said at least one clamping column, being produced in such a manner as to prevent any rotational movement of said at least one clamping column relative to the bearing plates;

the first fixing means are arranged solely for fixing said bearing plates to the connection board;

it includes second fixing means for fixing a thermal energy dissipation radiator on at least one of said bearing plates, the second fixing means being independent of and separate from the first fixing means, the second fixing means comprise a torsion clip arranged to bear against one of the bearing plates and the corresponding radiator.

A further subject of the invention is an electronic card, characterised in that it includes a device for retaining by pressure at least two electronic components disposed opposite each other and on each side of the same connection board, the retaining device being according to the invention.

BRIEF DESCRIPTION OF THE DRAWINGS

The invention will be understood more clearly on reading the following description, provided solely by way of example and prepared with reference to the drawings, in which:

In FIG. 1, identical or similar parts bear the same reference.

DETAILED DESCRIPTION OF THE INVENTION

Figure 1:
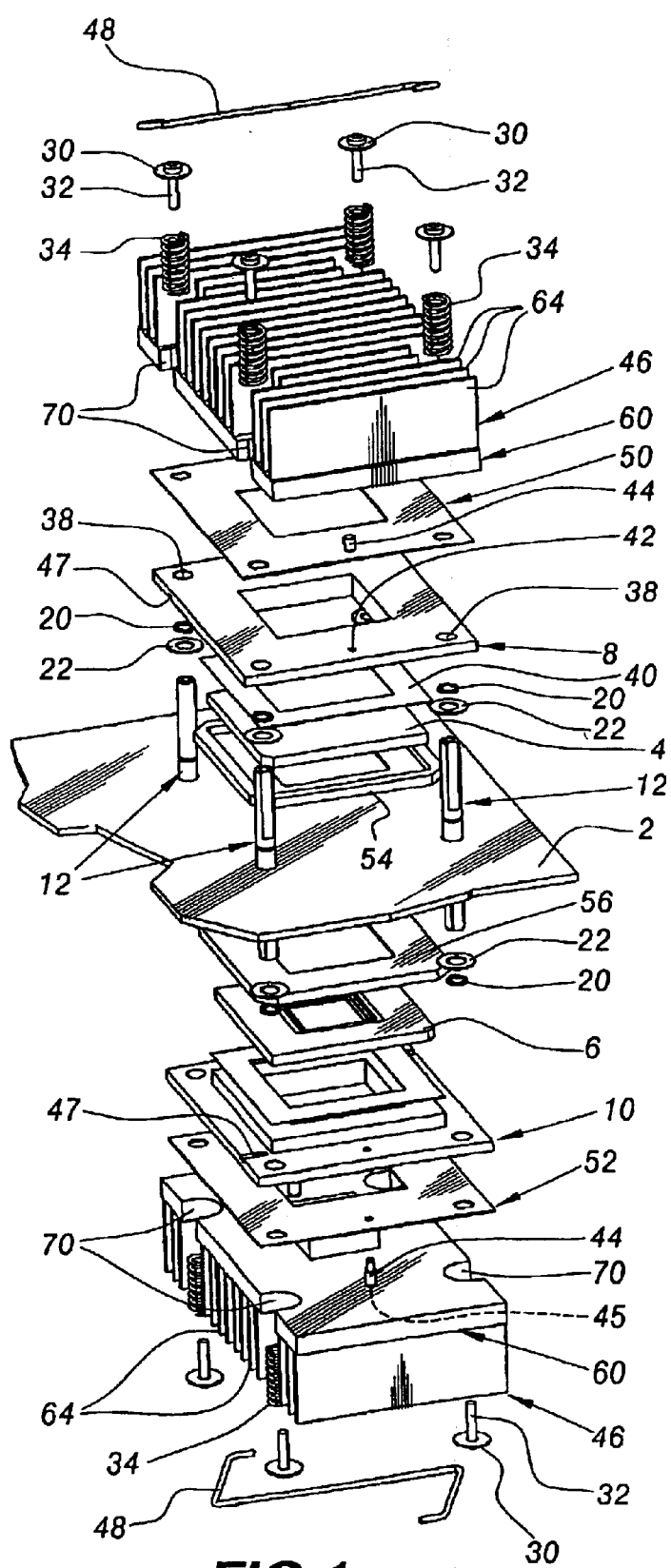
FIG. 1 is an exploded perspective view of the different elements of a pressure retaining device according to the invention.

FIG. 1 shows a printed circuit board 2 on each face of which a first and a second LGA integrated circuit 4, 6 are intended to be assembled opposite each other by means of a pressure retaining device.

The pressure retaining device comprises bearing plates 8, 10 disposed on each side of the board 2 and intended to be fixed to each other by first fixing means.

The first clamping means comprise four small clamping columns 12 (the fourth column is not visible in FIG. 1) intended to be slidingly mounted in holes formed in the board 2. The clamping columns have a cylindrical shape with a flat formed along a portion of the length in the axial direction. At each end of each column, a threaded bore is provided in a plane perpendicular to the longitudinal axis of the columns for receiving the means for exerting a thrust force in the direction of the board.

Each column also comprises a pair of spaced grooves disposed on opposite sides of an imaginary plane passing through the center of the columns, that is, on each side of the middle of each length. The grooves 12 form a receiving means for receiving a fixing abutment. Each groove extends around a corresponding column 12. The grooves are spaced by a distance slightly greater than the thickness of the board so as to provide a balancing clearance between each fixing abutment and the printed circuit board 2. This spacing between the two fixing abutments is also selected so as to permit a minimum retaining force to be exerted on one of the LGA integrated circuits 4, 6 during the assembly of the retaining device. A description of the minimum retaining force will be given with reference to FIG. 2. For this purpose, the balancing clearance should not be too large. For example, the grooves are spaced from each other by 5 mm when the thickness of the board 2 is around 1.5 mm.

The fixing abutments, intended to be mounted in pairs on each clamping column, are here formed by a stop ring 20 and a washer 22. The stop ring is for example a circlip arranged to be introduced into the grooves provided on the clamping columns. The washer 22 has an outside diameter greater than that of the holes in the board 2 and a central opening large enough for slidingly receiving the clamping columns 12.

The urging means or resilient housing means is mounted at each end of the clamping columns, and arranged to exert on the corresponding bearing plate a thrust force in the direction of the board 2. For that purpose, they comprise a thrust support and spring means. The thrust support is here provided by means of a washer 30 and a screw 32. The washer 30 is constructed and arranged so as to slide onto the end of the clamping columns 12. The screw is arranged to be mounted in the threaded bore located at the end of the clamping columns. The head of the screw 32 is wide enough to block the washer 30 in translation when the latter is displaced along one of the columns.

A helical spring 34 is slidingly mounted at the end of each clamping column and intended to be interposed between the thrust support and the corresponding bearing plate to provide the bracing force.

The bearing plates 8 and 10 are identical and only the bearing plate 8 will be described herein. The bearing plate 8 is a rectangular aluminum plate having a central rectangular opening. It has four circular holes 38, one hole disposed in proximity to each corner of the plate and intended for slidingly receiving a clamping column 12. The lower face of the plate 8, that is to say, the face turned towards the board 2, receives a thin electrical insulation plate 40. In the electrical insulation plate 40, a rectangular opening of the same dimensions as those of the plate 8 is formed. Two holes 42 pass through the plate 8 from one side to the other (only one of these holes is visible in FIG. 1). Each hole 42 receives a locating stud 44 of a radiator or heat sink 46. The locating studs 44 are formed of two cylindrical parts of different end diameters. The part or end having the smaller diameter is arranged to be inserted into the hole 42, while the part or end having the larger diameter is adapted to be inserted in a corresponding hole 45 formed in the radiator or heat sink 46. Two notches 47 for receiving a torsion clip 48 are also formed in the edge of the plate 8.

The pressure retaining device also comprises two locking plates 50, 52 disposed on opposite sides of the printed circuit board for locking the clamping columns 12 in rotation, and two inserts 54, 56. The locking plates 50, 52 are intended to be placed on the upper face of the bearing plates 8, 10. They are produced by cutting out a rectangle of the same dimensions as the bearing plate 8 from a 5/10 thick steel sheet. They each include two holes (not shown) for the passage of the locating studs 44. A central rectangular opening, the dimensions of which are the same as those of the central opening of the plate 8, and four holes, one at each corner, are formed in the locking plates 50 and 52. The central opening and the holes are produced so as to be aligned respectively with the central opening and the four holes of a bearing plate. Each of the holes of the locking plates 50 and 52 is intended for slidingly receiving one of the clamping columns 12 while preventing its rotation. For this purpose, the profile of each of the holes is adapted exactly to that of the clamping columns, having a flat along its circumference. Thus, the profile includes in particular a straight portion arranged to co-operate with the flat of each of the clamping columns to prevent the rotation of the latter.

Each of the inserts 54, 56 is intended to be disposed between one of the LGA integrated circuits 4, 6 and the board 2. These inserts comprise flexible electrical contacts suitable for establishing the electrical continuity between the contact terminals of the LGA integrated circuit and corresponding contact terminals of the board 2.

Finally, the pressure retaining device shown in FIG. 1 also comprises second fixing or clamping means for clamping a radiator to the bearing plates. The second fixing means are provided for example by means of the torsion clip 48.

FIG. 1 also includes two identical heat dissipation radiators 46. Each radiator 46 comprises a plate 60, the lower surface of which is intended to be placed on one of the locking plates 50, 52. This lower surface of the plate 60, turned towards the board 2, has in its centre a projecting parallelepiped arranged to be slid inside the central openings of the locking plate, of the bearing plate, and of the electrical insulation. The surface of the parallelepiped which is intended to come into contact with one of the LGA integrated circuits 4, 6 is equipped with a heat seal (not shown) in order to improve the heat exchanges with the LGA integrated circuit.

The upper part of the plate 60 has ventilation fins 64 disposed perpendicularly to the surface of the plate 60 and parallel to one another. The fins are suitable for improving the thermal exchanges between the ambient medium and the radiator 46. This upper surface of the plate 60 is also arranged to receive a bearing portion of the torsion clip 48.

Notches 70 are provided in the edge of the plate 60 to receive the first fixing means of the pressure retaining device. The notches are wide enough to receive without contact the springs 34 of the urging means.

The assembly of the pressure retaining device of FIG. 1 will now be described with reference to FIG. 2.

Figure 2:
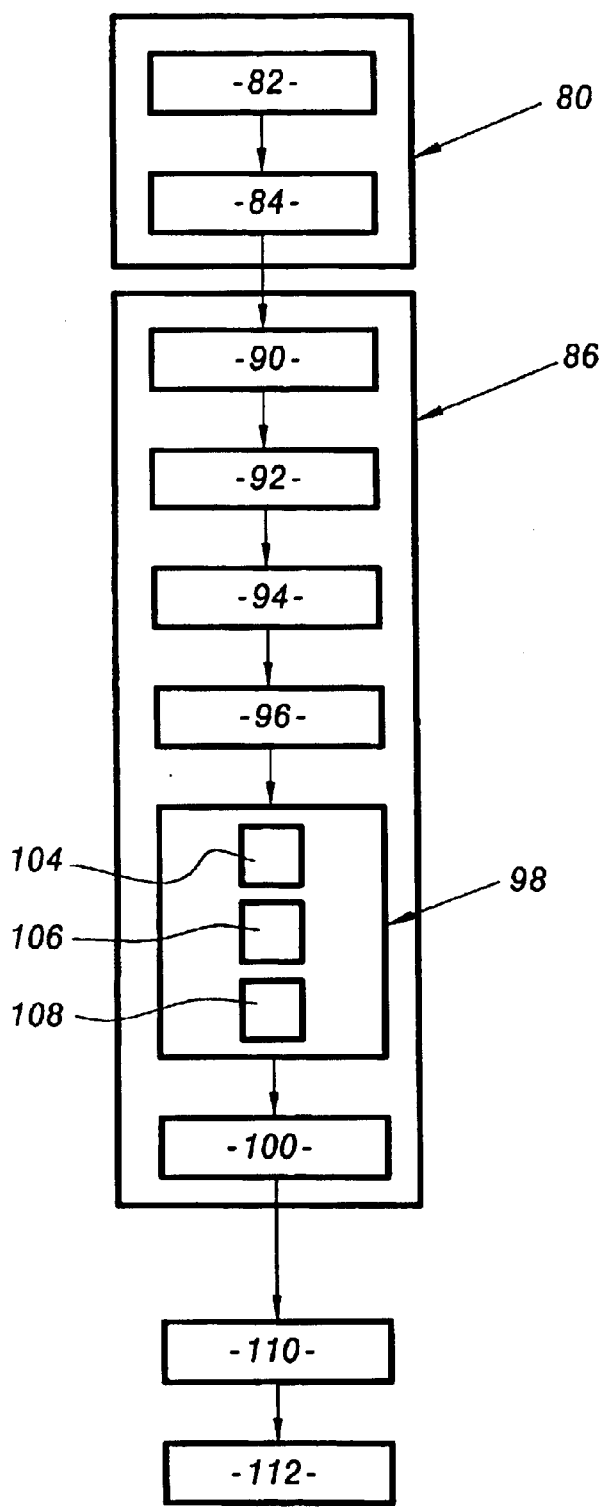
FIG. 2 is a flow chart of a method for assembling a pressure retaining device according to the invention.

The method of assembly of FIG. 2 includes a step 80 of fixing the clamping columns 12 to the printed circuit board 2. This step 80 comprises two main operations 82 and 84, carried out for each of the clamping columns. The operation 82 consists in sliding a clamping column 12 into one of the holes of the printed circuit board 2 provided for this purpose. The clamping column 12 is lodged in the hole in the board 2 so that the abutments for fixing the board can be mounted on each side of the board 2.

The operation 84 consists in fixing the clamping column 12 placed through the board 2 during the preceding operation by means of fixing abutments. Since the fixing abutments are provided here by means of the stop ring 20 and the washer 22, the operation 84 consists in sliding the washer 22 round the clamping column then introducing the stop ring 20 into the groove of the clamping column 12 provided for this purpose so as to maintain the washer 22 lodged between the board 2 and the stop ring 20. The fixing abutments of each column are mounted on each side of the board 2. At the end of this step 80, the spacing of the two fixing abutments of each column permits the displacement in translation of the latter in the corresponding holes of the board 2 between two end positions in which one of the fixing abutments bears against one of the faces of the board 2. The travel in translation of each column between these two end positions is defined by the balancing clearance. At that stage of assembly, the columns are free to rotate.

When the clamping columns 12 have been mounted, a step 86 of retaining the first LGA integrated circuit 4 by pressure begins. This step 86 comprises seven successive sub-steps 90, 92, 94, 96, 98, 100 and 102.

During these sub-steps, the board 2 is kept horizontal and the different elements assembled thereon are on the side of the board facing upwards. Thus these different elements are held on the board 2 by gravity.

The sub-step 90 consists in placing the insert 54 in contact with the contact terminals of the board 2 and then placing the LGA integrated circuit 4 in the insert 54 so that the contact terminals of the integrated circuit 4 are electrically connected to those of the board 2 when a pressure is exerted on the inactive face of the LGA integrated circuit 4.

The sub-step 92 consists in sliding the bearing plate 8, pre-equipped with the electrical insulation 40, onto the clamping columns 12 fixed to the board during step 80. In order so to do, each of the clamping columns 12 is introduced into the holes disposed at the four corners of the bearing plate 8. At the end of this sub-step, the electrical insulation 40 disposed on the lower face of the bearing plate 8 is in contact with the inactive face of the LGA integrated circuit 4.

During the sub-step 94, the locking plate 50 for locking in rotation is placed on the upper surface of the bearing plate 8. To this end, each clamping column 12 is slid into the corresponding hole of the plate 50. The flat of each clamping column 12 then co-operates with the straight part of the holes provided in the plate 50 in order to lock the clamping columns 12 in rotation.

The, during sub-step 96, the cylinder of smaller diameter of the locating studs 44 is inserted, through the plate 50, into the holes 42 of the bearing plate 8.

The sub-step 98 is a step for mounting urging means at the ends of the clamping columns located at the top, in order to exert a thrust force on the plate 8 in the direction of the board 2. This sub-step consists in repeating three operations 104, 106 and 108 for each of the ends located at the top. The operation 104 consists in sliding a spring 34 round the end of the clamping column. One of the ends of the spring 34 bears against the plate 50. The operation 106 consists in disposing on the axis of the spring and on its opposite end from that in contact with the plate 8, one of the washers 30. During the operation 108, one of the screws 32 is introduced into the central opening of the washer 30 and of the helical spring 34 in order to be screwed into the threaded bore provided at the end of the clamping column 12. Thus, the screw 32 and the washer 30 compress the spring 34 against the bearing plate 8, the spring 34 then urging the bearing plate 8 in the direction of the printed circuit board 2.

At the end of sub-step 98, the four mounted springs 34 urge the bearing plate 8 against the inactive surface of the LGA integrated circuit. The bearing plate 8 thus exerts a minimum retaining force on the inactive face of the LGA integrated circuit 4. The springs 34 also exert a reaction force against the washers 30 and the screws 32, thereby tending to displace the clamping columns 12 upwards. The clamping columns 12 therefore exert on the board 2, by way of the fixing abutments located on the same side as the downwardly turned face of the board 2, a clamping force in the direction of the bearing plate 8. This clamping force is transmitted by way of the board 2 to the insert 54 and is therefore exerted on the active face of the LGA integrated circuit 4. Thus, the insert 54 and the LGA integrated circuit 4 are held wedged by a minimum retaining force between the bearing plate 8 on the one hand and the printed circuit board 2 on the other hand.

During the sub-step 100, the radiator 46 is placed on the locking plate 50. In order so to do, the cylindrical part of larger diameter of the locating studs 44 is inserted into the corresponding holes 45 of the plate 60 of the radiator 46. Then, during this same step, the second fixing means, that is to say, the torsion clip 48, is mounted in the notches, provided for this purpose, of the bearing plate 8 and bearing on the corresponding surfaces of the radiator 46 to exert a force retaining the latter in thermal contact with the locking plate 50 for locking in rotation. Since the second fixing means for fixing the radiator are independent of the first fixing means for fixing the bearing plate 8 to the printed circuit board 2, the force necessary for producing a good thermal contact is defined independently of the retaining force exerted on the LGA integrated circuit 4.

Step 86 continues with a step 110 consisting in turning over the board 2 so that the surface intended to receive the LGA integrated circuit 6 faces upwards.

After the turning step 110, a step 112 for retaining by pressure the second LGA integrated circuit 6 is carried out. This step 112 is similar to step 86 and will not therefore be described in detail.

At the end of this step 112, the reaction force exerted by the four springs 34 located on a first side of the board 2, that is to say, on the same side as the plate 8, on the four thrust supports located on the same side, is no longer transmitted to the board 2 by way of the fixing abutments, but transmitted to the thrust supports located on the second side of the board 2 by way of the clamping columns 12. This reaction force, transmitted to the thrust supports located on the second side, is equal in amplitude to the thrust force exerted in the opposite direction on the bearing plate 10 by the springs 34 located on the second side. This thrust force exerted by the springs located on the second side is equal to the force exerted by the plate 10 on the inactive face of the LGA integrated circuit 6. This retaining force exerted by the bearing plate 10 is also exerted by way of the insert 56 on the face of the board 2 located on the second side. Moreover, the reaction force exerted by the springs 34 located on the first side is equal to the thrust force that they exert on the bearing plate 8. This thrust force exerted by the springs located on the first side is equal to the retaining force exerted by the bearing plate 8 on the inactive face of the LGA integrated circuit 4. This retaining force exerted by the bearing plate 8 is also transmitted to the face of the board 2 located on the first side by way of the insert 54. Thus, since the forces exerted on each side of the board 2 are equal, a balancing of the retaining forces exerted by the bearing plates 8 and 10 is obtained. Under these conditions, the fixing abutments of each of the clamping columns do not bear on any of the faces of the printed circuit board 2. The pressure retaining device described here makes it possible to balance the retaining forces exerted by each of the bearing plates 8 and 10. It is therefore no longer necessary to calibrate the springs 34 very precisely in order to obtain the same retaining force on each of the LGA integrated circuits.

The pressure retaining device described here also makes it possible, owing to the presence of fixing abutments on the clamping columns, to mount and dismantle the first fixing means without special tools. In fact, when only one of the LGA integrated circuits is mounted, a minimum retaining force for this first LGA integrated circuit is exerted thereon owing to the fixing abutments of the clamping columns. Thus, the board 2 can be turned over in order to mount the second LGA integrated circuit, since the first LGA integrated circuit is retained by this minimum retaining force.

The area necessary for installing the first fixing means on the board 2 is less than that necessary for installing the known fixing means such as the inserts and nuts. The retaining device described here therefore also makes it possible to increase the useful area of the board 2 for forming the printed circuit. In fact, the printed circuit is formed by known methods even beneath the washers 22.

Finally, the locking plates 50, 52 effect, at very little cost, the immobilisation of the clamping columns in rotation. In fact, the cost of producing a hole, the profile of which includes for example a linear portion, is less than the cost of producing a hole having the same profile in the bearing plates.

As a variant, the clamping columns are formed of a first and a second pillar of the same length placed end to end. Each pillar comprises a first and a second end. The first end is arranged to receive urging means for urging the bearing plates. This first end is for example identical to that of the clamping columns 12 and therefore also includes a flat. The second end is intended to slide in the holes of the printed circuit board. This second end includes means for assembling the first and second pillars to each other. Each pillar also comprises a boss set back slightly from the second end, intended to fulfil the same functions as one of the fixing abutments described previously. These bosses are therefore far enough away from the second end to provide a balancing clearance between the printed circuit board and the boss.

The method of assembly of this variant is similar to that described with reference to FIG. 2, with the exception of the step 80 for fixing the clamping columns. In fact, this step 80 no longer includes operations for the sliding introduction of the clamping columns but operations for assembly of the first and second pillars to one another in the holes of the printed circuit board. Once a first and a second pillar have been assembled to each other, they form a clamping column mounted so as to be displaceable in translation in the holes of the printed circuit board, this displacement in translation being limited on each side of the printed circuit board by the bosses of the pillars.

A variant of the method of assembly of FIG. 2 consists in carrying out in advance the assembly of the bearing plate 8, the electrical insulation 40, the locking plate 50, and the two studs 44 so as to produce a pre-assembled unit. Thus, in this variant, the sub-steps 92, 94 and 96 of the method of FIG. 2 are replaced by a single sub-step consisting in sliding this pre-assembled unit onto the clamping columns 12.

The device for retaining an electronic component has been described here in the particular case where it comprises four clamping columns. However, variants with one, two or three or more clamping columns may be produced. Thus, for example, the retaining device comprises a single clamping column when two pairs of electronic components are disposed opposite each other and on each side of the printed circuit board. In this variant, the column passes through the printed circuit board between the two electronic components forming each pair of electronic components. Moreover, the retaining device is arranged so that, once mounted, the single clamping column passes through the different elements of the retaining device in proximity to their respective centre of gravity.

What is claimed is:

1. A device for retaining by pressure at least two electronic components disposed opposite each other and on each side of the same connection board, said device comprising:

two rigid bearing plates disposed on each side of the connection board for exerting a retaining force by pressure on the electronic components in the direction of the connection board, and first clamping means for clamping the bearing plates to the connection board comprising at least one small clamping column, and resilient bracing means mounted at the end of said at least one clamping column for exerting a force on one of the bearing plates in the direction of the connection board, the connection board having openings in which said at least one clamping column is arranged to be mounted so as to be displaceable in translation in said openings in order to pass through the connection board at each end of the column two fixing abutments for limiting the translation of said at least one clamping column through the connection board, said fixing abutments each being disposed on each side of the connection board, spaced from each other by a distance strictly greater than the thickness of the board so as to provide between the board and the abutments a clearance for balancing the retaining force between the two bearing plates.

2. A device according to claim 1, characterised in that said at least one clamping column comprises two receiving means for receiving the fixing abutments spaced from each other by a distance strictly greater than the thickness of the board so as to provide between the board and the abutments the clearance for balancing the retaining force between the two bearing plates.

3. A device according to claim 1, characterised in that the abutments comprise a stop ring.

4. A device according to claim 1, characterised in that the abutments comprise a washer.

5. A device according to claim 1, characterised in that the resilient bracing means comprise thrust supports fixed to each end of said at least one clamping column and arranged to be interposed between the thrust support and one of the bearing plates in order to urge said one of the bearing plates against the electronic components.

6. A device according to claim 5, characterised in that the resilient means comprise springs.

7. A device according to claim 1, characterised in that it comprises a plate for locking the said at least one clamping column in rotation, an opening in said plate for slidingly receiving said at least one clamping column, the profile of the opening, and that of said at least one clamping column being so as to prevent any rotational movement of said at least one clamping column relative to the bearing plates.

8. A device according to claim 1, characterised in that the first clamping means are arranged solely for clamping said bearing plates to the connection board.

9. A device according to claim 1, further comprising second clamping means for mounting a thermal energy dissipation radiator on at least one of said bearing plates, the second clamping means being independent of and separate from the first clamping means.

10. A device according to claim 9, characterised in that the second clamping means comprise a torsion clip arranged to bear on one of the bearing plates and on the corresponding radiator.

11. An integrated circuit electronic card comprising
pressure means for retaining at least two electronic components disposed opposite each other and on each side of a connection board,
two rigid bearing plates disposed on each side of the connection board for exerting a retaining force by pressure on the electronic components in the direction of the connection board, and
first clamping means for clamping the bearing plates to the connection board comprising at least one small clamping column, and
resilient bracing means mounted at the end of said at least one clamping column for exerting a force on one of the bearing plates in the direction of the connection board, the connection board having openings in which said at least one clamping column is arranged to be mounted so as to be displaceable in translation in said openings in order to pass through the connection board at each end of the column, two fixing abutments for limiting the translation of said at least one clamping column through the connection board, said fixing abutments each being disposed on each side of the connection board, spaced from each other by a distance strictly greater than the thickness of the board so as to provide between the board and the abutments a clearance for balancing the retaining force between the two bearing plates.

12. An integrated circuit electronic card as set forth in claim 11 wherein said at least one clamping column comprises two receiving means for receiving the fixing abutments spaced from each other by a distance strictly greater than the thickness of the board so as to provide between the board and the abutments the clearance for balancing the retaining force between the two bearing plates.

13. An integrated circuit electronic card as set forth in claim 11 characterised in that the abutments comprise a stop ring.

14. An integrated circuit electronic card as set forth in claim 11 characterised in that the abutments comprise a washer.

15. An integrated circuit electronic card as set forth in claim 11 characterised in that the resilient bracing means comprise thrust supports fixed to each end of said at least one clamping column and arranged to be interposed between the thrust support and one of the bearing plates in order to urge said one of the bearing plates against the electronic components.

16. An integrated circuit electronic card as set forth in claim 15, characterised in that the resilient means comprise springs.

17. An integrated circuit electronic card as set forth in claim 11 characterised in that it comprises a plate for locking the said at least one clamping column in rotation, an opening in said plate for slidingly receiving said at least one clamping column, the profile of the opening, and that of said at least one clamping column being so as to prevent any rotational movement of said at least one clamping column relative to the bearing plates.

18. An integrated circuit electronic card as set forth in claim 11 characterised in that the first clamping means are arranged solely for clamping said bearing plates to the connection board.

19. An integrated circuit electronic card as set forth in claim 11 further comprising second clamping means for mounting a thermal energy dissipation radiator on at least one of said bearing plates, the second clamping means being independent of and separate from the first clamping means.

20. An integrated circuit electronic card as set forth in claim 10 wherein the second clamping means comprise a torsion clip arranged to bear on one of the bearing plates and on the corresponding radiator.

* * * * *